(12) United States Patent
Miller

(10) Patent No.: US 7,283,995 B2
(45) Date of Patent: Oct. 16, 2007

(54) NQL—NETLIST QUERY LANGUAGE

(75) Inventor: Eric Miller, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 561 days.

(21) Appl. No.: 10/956,860

(22) Filed: Sep. 30, 2004

(65) Prior Publication Data

US 2006/0074878 A1    Apr. 6, 2006

(51) Int. Cl.
  *G06F 17/30* (2006.01)
  *G06F 7/00* (2006.01)
(52) U.S. Cl. ............................................. 707/3; 716/11
(58) Field of Classification Search ................ 707/3; 716/11
See application file for complete search history.

(56) References Cited

U.S. PATENT DOCUMENTS

| | | | |
|---|---|---|---|
| 5,463,563 A | 10/1995 | Bair et al. | |
| 5,493,508 A | 2/1996 | Dangelo et al. | |
| 5,751,592 A * | 5/1998 | Takai et al. | 716/5 |
| 5,828,580 A * | 10/1998 | Ho | 716/12 |
| 5,856,925 A | 1/1999 | Maeda et al. | |
| 6,128,768 A * | 10/2000 | Ho | 716/5 |
| 6,152,612 A * | 11/2000 | Liao et al. | 703/23 |
| 6,529,913 B1 * | 3/2003 | Doig et al. | 707/101 |
| 6,910,200 B1 | 6/2005 | Aubel et al. | |
| 7,206,731 B2 * | 4/2007 | Sercu et al. | 703/14 |
| 2006/0074938 A1 * | 4/2006 | Miller | 707/100 |

OTHER PUBLICATIONS

Gwo-Dong Chen, Daniel D. Gajski, An Intelligent Component Database For Behavioral Synthesis, 1990 27th ACM/IEEE Design Automation Conference, pp. 150-155.*

Krishnendu Chatterjee, Weighted Quantified CTL: An efficient logic for verifying external timing queries in Timed Model, May 2001, Department of Computer Science and Engineering Indian Institute of Technology, pp. 36-38.*

Amit Basu, Rafiul Ahad, An SQL-based Query Language For Networks of Relations, Sigmod Record, Mar. 1990, vol. 19, No. 1, pp. 8-17.*

* cited by examiner

*Primary Examiner*—Christian Chace
*Assistant Examiner*—Joshua Bullock
(74) *Attorney, Agent, or Firm*—Cochran, Freund & Young LLC

(57) ABSTRACT

Disclosed is a netlist query language that reads and updates electrical circuit data stored in a netlist database that stores electrical circuit data parsed from a netlist text file. To obtain the netlist text file, an electrical circuit schematic of an electrical circuit is created using a commercially available electrical schematic capture software tool. The electrical schematic capture software tool is then directed to create the netlist text file that is representative of the electrical circuit. The netlist text file is then parsed, and the parsed netlist data that is representative of the electrical circuit is stored in the netlist database. The netlist database provides netlist database access subroutines that allow a software program to read and update data stored in the netlist database. Sophisticated programming skills are required to read and update the netlist database using the netlist database access subroutines. The netlist query language eases the burden of reading and updating the netlist database by providing a language syntax similar to the common relational database Structured Query Language (SQL). A netlist query language server program translates the netlist query language document into the appropriate netlist database access subroutine calls.

46 Claims, 12 Drawing Sheets

SET (CONDITIONS_CLAUSE)

1002          1004

1000 NQL EMBEDDED QUERY SYNTAX

FIGURE 10

NQL—NETLIST QUERY LANGUAGE

BACKGROUND OF THE INVENTION a. Field of the Invention

The present invention pertains generally to integrated circuit design and manufacturing, and more specifically to software and database techniques that aid in analyzing an electrical circuit that is intended to be manufactured as an integrated circuit.

b. Description of the Background

The process of creating an integrated circuit begins by first designing an electrical schematic of an electrical circuit that will someday be created as an integrated circuit. Until the electrical circuit schematic is designed, the layout of the integrated circuit cannot begin. To make circuit design more efficient and less prone to error, software tools have been created to assist in creating the electrical circuit schematic drawing. The software tool, commonly called electrical schematic capture software, allows an electrical circuit designer to create an electrical circuit schematic in much the same manner as computer aided design (CAD) software tools assist a mechanical draftsperson in creating a mechanical drawing of a physical device. Some of the most common electrical schematic capture software tool vendors include: Mentor Graphics Corporation, Cadence Design Systems, and Synopsys, Inc. Many of the electrical schematic capture software tool vendors also supply electrical circuit analysis and simulation software tools, and integrated circuit layout and testing software tools. Mentor Graphics Corporation is located at 8005 SW Boeckman Road, Wilsonville, Oreg. 97070, and may be contacted at phone numbers 800-592-2210 and 503-685-7000, or on the Internet at www.mentor.com. Cadence Design Systems is located at 2655 Seely Avenue, San Jose, Calif. 95134, and may be contacted at phone number 408-943-1234, or on the Internet at www.cadence.com. Synopsys, Inc. is located at 700 East Middlefield Road, Mountain View, Calif. 94043, and may be contacted at phone numbers 650-584-5000 and 800-541-7737, or on the Internet at www.synopsys.com.

The electrical circuit designer typically lays out an electrical circuit schematic by placing primitive electrical devices onto an electrical schematic page. The electrical circuit designer then connects the primitive electrical devices with a line in a manner that creates the desired electrical circuit. The line represents an electrically connecting wire, or an electrical short, between the connected primitive electrical devices. A primitive electrical device is a basic electrical device that cannot be broken down into smaller devices within the electrical schematic capture software. The primitive electrical device is typically a device such as a resistor, capacitor, inductor, diode, transistor, and other similar basic electrical devices. The attributes, or properties, of each primitive electrical device are specified by the electrical circuit designer, and stored within the electrical schematic capture software. The device attributes determine the type and characteristics of each primitive electrical device within the system. For instance, a resistor might have attributes to define resistance, power ratings, and electrical connection points. Other primitive electrical devices would have similar, appropriate attributes to define the electrical characteristics for the primitive electrical device.

Many times, an electrical circuit designer may want to reuse a part of a circuit, sometimes called a sub-circuit, in other sections of the overall circuit. This is accomplished within the electrical schematic software tool by defining a sub-circuit as a macro. The macro has macro attributes similar to the primitive electrical device that define the external electrical connection points for the macro. The makeup of the internal electrical devices determine the electrical behavior of the macro. A macro can be made up of other macros defined within the electrical schematic capture software tool, as well as primitive electrical devices.

After the electrical circuit schematic is completed, the electrical circuit represented by the electrical circuit schematic is simulated to insure the electrical circuit functions as desired by the circuit designer. The simulation of the electrical circuit may be performed by the electrical schematic capture software tool, or by another analysis software tool. The choice of using the electrical schematic capture software tool simulation or an external simulation software tool depends on the complexity of the electrical circuit, and the complexity of the desired simulation. In order to allow an external software tool to analyze the electrical circuit, the electrical schematic software tool has the ability to create a netlist text file representing the electrical circuit in a text form. The netlist text file contains all of the data defining the primitive electrical devices, the electrical attributes of each primitive electrical device, the sub-circuit macros, the electrical attributes of each macro, the electrical connections for all of the primitive electrical devices and macros, and the attributes of each electrical connection including the connection point of each primitive electrical device and macro included in each electrical connection.

The netlist text file is imported by the external analysis software, and the electrical circuit is simulated. If errors in the electrical circuit are found, changes are made to the electrical circuit schematic in the electrical schematic software package. The netlist text file for the updated electrical circuit schematic is created and imported into the analysis software. The simulation and circuit schematic modification is repeated until the electrical circuit functions as desired on the simulator. Many of the analysis software tools allow the user to make modifications to the circuit being simulated so that the analysis process is not too cumbersome.

Once the electrical circuit functions properly within the simulator, the electrical circuit must then be created as an integrated circuit. The same netlist text file used to send electrical circuit data to external analysis and simulation software tools is used to export electrical circuit data to an integrated circuit layout software tool. The integrated circuit layout software tool imports the electrical circuit data in the netlist text file, and uses the electrical circuit data to layout the physical features of the integrated circuit that create the desired electrical circuit. After the integrated circuit layout is performed additional analysis and simulation of the integrated circuit is performed. The analysis and simulation of the integrated circuit allows the circuit designer to perform topological checks of the integrated circuit to find parasitics within the integrated circuit layout. A topological check may be configured to look for layout guidelines, known as Design Rule Checks (DRC's). For example, a topological check may look for a circuit element that has two MOSFET transistors connected together from the drain of one transistor to the gate of the other transistor, and where the source of each transistor is connected to a different ground plain. Since the ground plains may be at different electrical potentials there is a parasitic effect between the two transistors that may cause problems in the function of the circuit that would not be present in a simulation of the electrical circuit that does not include the physical integrated circuit layout. If problems are found during the analysis and simulation of the integrated circuit layout, the circuit changes are made using the electrical schematic capture software tool and the integrated circuit layout is performed again.

After a satisfactory analysis and simulation is performed on the integrated circuit layout, the integrated circuit is created and electrically tested for proper operation. If a problem is encountered, the electrical circuit schematic must be updated within the electrical schematic software tool, and the testing, simulation, layout, and manufacturing of the integrated circuit must be performed again to insure a properly functioning integrated circuit.

The present application is filed simultaneously with application Ser. No. 10/956,862, entitled "Netlist Database" by the present inventor, Eric Miller, filed Sep. 30, 2004, the full text of which is hereby specifically incorporated by reference for all it discloses and teaches.

A netlist database is an object oriented netlist database as disclosed in the above mentioned application Ser. No. 10/956,862, entitled "Netlist Database." A netlist database stores electrical circuit data parsed from a netlist text. To obtain the netlist text file, an electrical circuit schematic of an electrical circuit is created using a commercially available electrical schematic capture software tool. The electrical schematic capture software tool is then directed to create the netlist text file that is representative of the electrical circuit. A netlist text file parser program first creates the object oriented netlist database structure, then parses the netlist text file, and finally fills the netlist database with objects that represent the electrical circuit data contained in the netlist text file.

Structured Query Language (SQL) is a computer language for reading and updating relational databases. SQL uses statements to perform instructions to create, read, change, or delete data in a relational database. A relational database is made up of tables. Each table contains records of an item of data. Each record holds data in predefined fields, or data elements. A typical query statement to retrieve data from a relational database consists of a syntax of the form of "SELECT field FROM table WHERE condition." The "SELECT field" syntax specifies the field, or data element, of a record to obtain from the relational database table specified in the "FROM table" syntax. The "WHERE condition" syntax specifies a logical condition that must be met before a record is selected from the relational database "FROM table" for output into a query output sub-table. There is additional syntax for creating, changing, or deleting data within the relational database as well as more complex structures to allow more sophisticated searches of multiple tables, and sophisticated conditional logic for the "WHERE condition" syntax. SQL is a very common language used by many database programmers to access data in relational databases.

SQL is a non-proprietary (open) language with a language syntax set by several standards making bodies operating together. The standards bodies creating the SQL standard are the American National Standards Institute (ANSI), the International Organization for Standardization (ISO), and the International Electrotechnical Organization (IEC). The International Committee on Information Technology Standards (INCITS) is the joint committee in charge of the SQL standard. There are several versions of the SQL standard available for use by the public. The original SQL standard, ANSI X3.168-1989, is typically referred to as SQL 1. SQL 1 is the core definition of SQL, and most, if not all, of the SQL 1 standard is incorporated in later SQL standards. In fact, the second SQL standard revision, ANSI INCITS 135-1992 (formerly ANSI X3.135-1992, renamed in 1998), includes the entire SQL 1 standard. The second SQL standard revision is typically referred to as SQL 2. A third SQL standard revision is available under the name of INCITS/ISO/IEC 9075: 1999. The third SQL standard revision is typically called SQL 3. A forth SQL standard revision, INCITS/ISO/IEC 13249: 2003, has recently been released, but it has not been adopted by industry as completely as the older SQL revisions. All SQL revisions are available from ANSI at 11 West 42nd Street, New York, N.Y. 10036, or on the Internet at www.ansi.org.

SUMMARY OF THE INVENTION

The present invention overcomes the disadvantages and limitations of the prior art by providing a netlist query language to read and update a netlist database. The netlist query language has a language syntax similar to the common relational database Structured Query Language (SQL). Database programmers familiar with SQL will find it simple to write netlist query language programs. A netlist query language server translates a netlist query language document into the appropriate netlist database access subroutine calls. Using netlist database access subroutine calls to read and update the netlist database requires sophisticated programming techniques. The netlist query language hides the complexities of using the netlist database access subroutines, thus, making it much simpler to perform searches of the data stored in a netlist database. Because a netlist database may be generated before an electrical circuit is laid out for manufacture as an integrated circuit, a netlist query language document may be used to locate topological circuit problems within the electrical circuit prior to spending the time to lay out or manufacture the electrical circuit as an integrated circuit.

An embodiment of the present invention may therefore comprise a netlist query language for reading and updating a netlist database comprising: a netlist query language syntax that is similar to standard structured query language syntax, the netlist query language syntax defining syntax rules for writing netlist query language statements, the netlist query language statements being commands that read and update the netlist database, the netlist database being an object oriented database storing electrical circuit data, the electrical circuit data being representative of device data, device attribute data, macro data, macro attribute data, connection data, and connection attribute data of an electrical circuit, and the netlist database providing netlist database access subroutines for reading and updating the electrical circuit data stored in the netlist database.

An embodiment of the present invention may further comprise a netlist query language server program for translating a netlist query language document so as to read and update a netlist database comprising: a netlist query language document input that accepts the netlist query language document, the netlist query language document consisting of netlist query language statements, each netlist query language statement of the of the netlist query language statements being capable of operating on netlist database tables and intermediate data tables, the netlist database tables being electrical circuit data tables contained in the netlist database and the intermediate data tables being output tables produced by previously completed netlist query language statements of the netlist query language statements, and the netlist query language statements being written in a netlist query language, the netlist query language comprising: a netlist query language syntax that is similar to standard structured query language syntax, the netlist query language syntax defining syntax rules for writing the netlist query language statements, the netlist query language statements being commands that read and update the netlist database, the netlist database being an object oriented database storing electrical circuit data, the electrical circuit data being representative of device data, device attribute data, macro data, macro attribute data, connection data, and connection attribute data of an electrical circuit, and the netlist database providing netlist database access subroutines for reading and updating the electrical circuit data stored in the netlist database; dynamic memory tables for holding the intermediate data tables, intermediate data table manipulation subroutines that perform netlist query language operations on the intermediate data tables; a netlist query language interpreter algorithm that translates the netlist query language statements into netlist database access subroutines calls and intermediate table manipulation subroutine calls, the netlist database access subroutine calls and the intermediate table manipulation subroutine calls chosen according to the netlist query language syntax, the netlist database access subroutine calls being programmatic calls to the netlist database access subroutines that read and update the netlist database, the intermediate table manipulation subroutine calls being programmatic calls to the intermediate table manipulation subroutines; a netlist database dynamic link to permit the netlist query language server program to invoke the netlist database access subroutine calls; a netlist database sub-table input for receiving netlist database sub-tables from the netlist database as requested by the netlist database access subroutine calls, the netlist database sub-tables being stored as the intermediate data tables; and a result output for delivering result tables, the result tables being output tables produced by the netlist query language statements.

An embodiment of the present invention may further comprise a method of searching a netlist database to find topological circuit problems comprising the steps of: creating a netlist query language document that is designed to find the topological circuit problems, the netlist query language document consisting of netlist query language statements, each netlist query language statement of the netlist query language statements being capable of operating on netlist database tables and intermediate data tables, the netlist database tables being electrical circuit data tables contained in the netlist database and the intermediate data tables being output tables of other netlist query language statements of the netlist query language statements, and the netlist query language statements being written in a netlist query language, the netlist query language comprising: a netlist query language syntax that is similar to standard structured query language syntax, the netlist query language syntax defining syntax rules for writing the netlist query language statements, the netlist query language statements being commands that read and update the netlist database, the netlist database being an object oriented database storing electrical circuit data, the electrical circuit data being representative of device data, device attribute data, macro data, macro attribute data, connection data, and connection attribute data of an electrical circuit, and the netlist database providing netlist database access subroutines for reading and updating the electrical circuit data stored in the netlist database; submitting the netlist query language document to a netlist query language server program, the netlist query language server program comprising: a netlist query language document input that accepts the netlist query language document; dynamic memory tables for holding the intermediate data tables; intermediate data table manipulation subroutines that perform netlist query language operations on the intermediate data tables; a netlist query language interpreter algorithm that translates the netlist query language statements into netlist database access subroutines calls and intermediate table manipulation subroutine calls, the netlist database access subroutine calls and the intermediate table manipulation subroutine calls chosen according to the netlist query language syntax, the netlist database access subroutine calls being programmatic calls to the netlist database access subroutines that read and update the netlist database, the intermediate table manipulation subroutine calls being programmatic calls to the intermediate table manipulation subroutines; a netlist database dynamic link that permits the netlist query language server program to invoke the netlist database access subroutine calls; a netlist database sub-table input that receives netlist database sub-tables from the netlist database as requested by the netlist database access subroutine calls, the netlist database sub-tables being stored as the intermediate data tables; and a result output for delivering result tables, the result tables being output tables produced by the netlist query language statements; and inspecting the result tables to locate the topological circuit problems.

BRIEF DESCRIPTION OF THE DRAWINGS

In the drawings,

FIG. 10 is an illustration of the language syntax of an embedded query syntax for an embodiment of a netlist query language.

DETAILED DESCRIPTION OF THE INVENTION

The typical rule in all design operations is that the earlier in the design process that an error is found, the less costly it is to correct the error. This design rule certainly applies to the manufacture of an integrated circuit. When an error is found in an integrated circuit design, the process must be started over at the beginning to correct the problem. If an error is found during the early stage of electrical circuit design, there is very little time or effort needed to update the electrical circuit schematic. If a problem is found after the electrical circuit has been laid out for manufacture as an integrated circuit, the electrical circuit schematic must be corrected, and the entire integrated circuit layout process must be repeated. Similarly, if a problem is found after the circuit is manufactured, the electrical circuit must be corrected, and the integrated circuit layout and manufacturing processes must be repeated. There are a number of analysis tools that analyze an electrical circuit schematic to ensure the electrical circuit represented by the schematic operates correctly. However, there is not a good analysis tool to inspect the electrical circuit schematic to locate topological circuit problems that are associated with creating the electrical circuit as an integrated circuit.

A netlist database (NDB) to store electrical circuit data representative of the electrical circuit may be created prior to laying out the electrical circuit as an integrated circuit. Using netlist database access subroutine calls to read and update the netlist database requires sophisticated programming techniques. Hiding the complexities of using the netlist database access subroutines makes it much simpler to perform searches of the data stored in a netlist database. A netlist query language that encapsulates the netlist database access subroutines makes it easier for circuit designers to search the netlist database. Further, making the netlist query language syntax similar to the common relational database Structured Query Language (SQL) syntax provides a familiar database access language for the many database programmers familiar with SQL. By writing a relatively simple netlist query language document, and submitting the netlist query language document to a netlist query language server program, a circuit designer may search a netlist database for topological circuit problems. Because a netlist database may be generated before an electrical circuit is laid out for manufacture as an integrated circuit, a netlist query language document may be used to locate topological circuit problems within the electrical circuit prior to spending the time to lay out or manufacture the electrical circuit as an integrated circuit.

Figure 1:
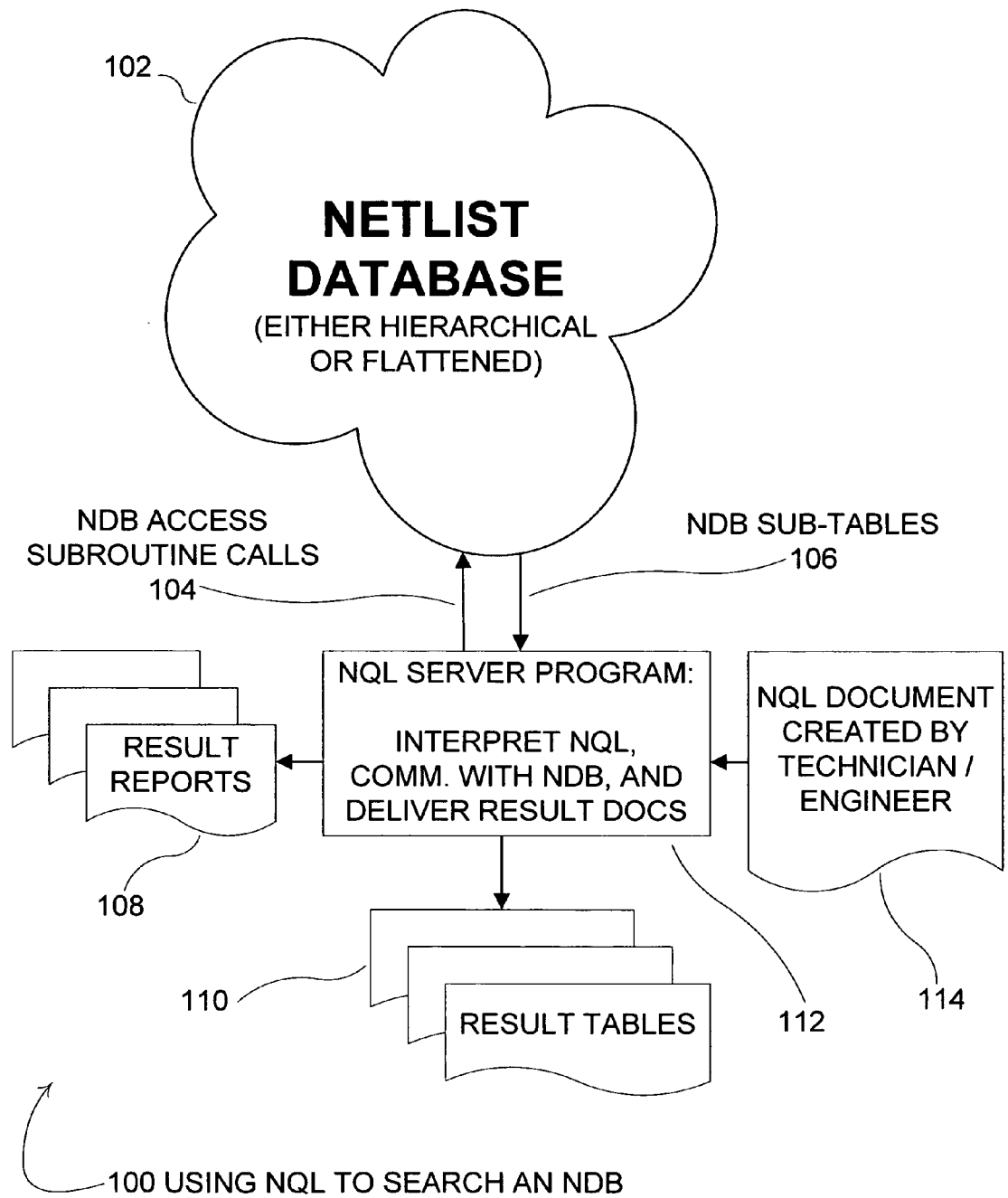
FIG. 1 is a schematic illustration of a process that translates a netlist query language document in order to search a netlist database.

FIG. 1 is a schematic illustration 100 of a process that translates a netlist query language document 114 in order to search a netlist database 102. A netlist query language (NQL) document 114 is submitted to a netlist query language server program. The netlist query language document 114 is created by a technician or engineer interested in searching a netlist database (NDB) 102. Typically the netlist query language document 114 is designed to search the netlist database 102 for topological circuit problems within the electrical circuit data stored in the netlist database 102. The netlist query language document 114 is submitted to a netlist query language server program 112. The netlist query language server program 112 translates the netlist query language document 114 according to the rules of the netlist query language syntax. The netlist query language syntax is similar to the standard Structured Query Language (SQL) syntax. The primary features of the netlist query language syntax embodiment discussed herein can be found in the original SQL 1 (ANSI X3.168-1989) standard documentation. Another embodiment of a netlist query language syntax might include features found in SQL 2, SQL 3, or later SQL standards.

The netlist query language server program 112 translates the netlist query language into netlist database access subroutine calls 104 and intermediate table manipulation subroutine calls. The netlist database access subroutine calls 104 retrieve data from the netlist database 102 as netlist database sub-tables 106. Intermediate table manipulation subroutines are subroutines built into the netlist query language server program 112 to manipulate intermediate data tables. The netlist database sub-tables 106 are stored in the netlist query language server program 112 as intermediate data tables. An intermediate data table is the output table of any query statement. An intermediate data table may be used as the source data table for a query statement. The result of a query statement using an intermediate data table as the source data is a query output table that becomes a new intermediate data table. When all query statements have been translated into programmatic subroutine calls, and the subroutine calls have been performed, the intermediate data tables become result tables 110. The result tables 112 are delivered to the netlist query language server program 112 user as the result of running the netlist query language document 114. If a formatted text report of data in the result tables is requested in the netlist query language document 114, the result reports 108 will be delivered to the netlist query language server program 112 user. The netlist query language server program 112 sequentially performs the netlist query language statements contained in the netlist query language document 114. That is, the first netlist query language statement in the netlist query language document 114 is performed first. The subsequent netlist query language statements in the netlist query language document 114 are performed in the order they appear in the netlist query language document 114, until the last netlist query language statement in the netlist query language document is performed.

The netlist database 102 contains electrical circuit data that is representative of an electrical circuit schematic that is intended to be laid out and manufactured as an integrated circuit. The netlist database 102 may be any embodiment of a netlist database 102, as long as all of the electrical circuit data describing the electrical circuit schematic is stored within, and accessible from, the netlist database 102. The electrical circuit data includes data defining device data, device attribute data, macro data, macro attribute data, connection data, and connection attribute data representative of the electrical circuit schematic that is going to be made into an integrated circuit.

Device data names and enumerates all primitive electrical devices contained in the electrical circuit schematic. A primitive electrical device is an electrical device that cannot be broken down into other electrical sub-devices within the electrical schematic capture software tool. A primitive electrical device is typically a basic electrical device such as a resistor, capacitor, diode, or transistor. Device attribute data contains the data used to characterize an individual electrical device, including the type of the electrical device. For instance, a resistor would have device attribute data defining the device as a resistor of one-hundred-fifty ohms resistance, a maximum power rating of fifty watts, and electrical connection points of pin one and pin two.

Macro data names and enumerates all macros contained in the electrical circuit schematic. A macro is a sub-circuit that is a grouping of primitive electrical devices and other macros. A macro might be an AND logic gate circuit or a signal amplifier circuit that an electrical circuit designer wishes to use repeatedly within a larger overall electrical circuit. Macro attribute data contains data that defines the macro including a list of all primitive electrical devices contained in the macro. Macro attribute data also contains a list of the other macros that are part of a macro. A macro cannot contain a reference to itself since that would cause a circular reference that would be difficult to resolve. Macro attribute data defines the external electrical connection points for the macro. For a macro with three external connection points, the electrical connection points might be called pin one, pin two, and pin three. Macro attribute data also defines the internal electrical connections of the primitive electrical devices and other macros contained in a macro. Primitive electrical devices contained in a macro are selected from the primitive electrical devices enumerated in the device data. Macros, excluding the macro being defined, contained in a macro are selected from the macros enumerated in the macro data. Internal electrical connections of the primitive electrical devices and other macros contained in a macro are selected from electrical connections enumerated in the connection data.

Connection data names and enumerates all electrical connections contained in the electrical circuit schematic. An electrical connection is an electrical short between two or more primitive electrical devices and/or macros. An electrical short can be thought of as a wire with zero resistance that connects to all of the primitive electrical devices and macros contained in an electrical connection. An electrical connection is sometimes called a net. Electrical connection attribute data defines which primitive electrical devices and which macros belong to an electrical connection. The connection point used by each primitive electrical device and the external connection point used by each macro contained in the electrical connection are also defined in the electrical attribute data. For example, an electrical connection might consist of a twenty ohm resistor connected at pin one of the resistor, a fifty milli-Henry inductor connected at pin two of the inductor, and a signal amplifier macro connected at input pin one of the signal amplifier macro. Primitive electrical devices contained in an electrical connection are selected from the primitive electrical devices enumerated in the device data. Macros contained in an electrical connection are selected from the macros enumerated in the macro data.

Figure 2:
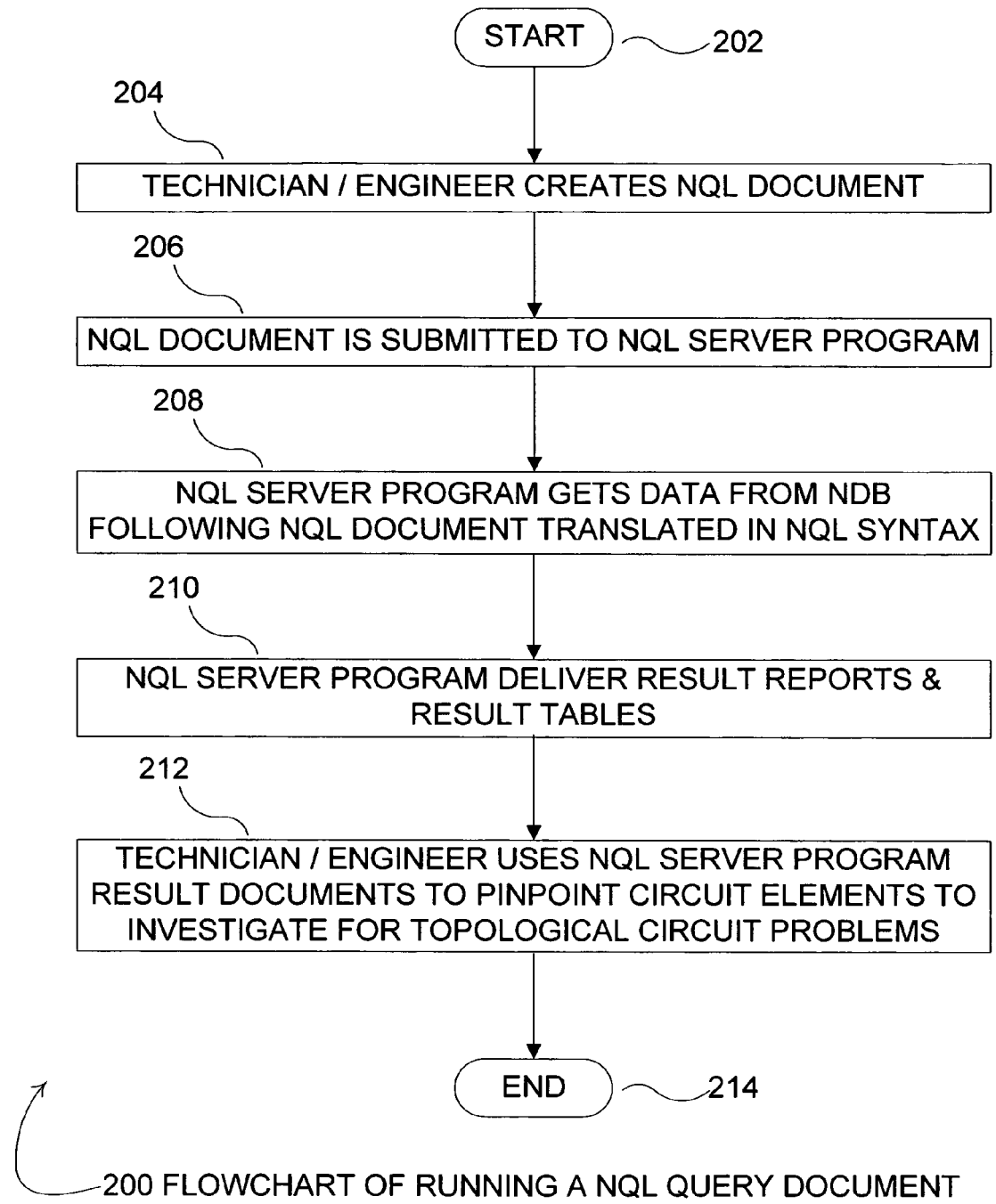
FIG. 2 is a flow chart describing the steps involved in the process of running a netlist query language document in order to search a netlist database.

FIG. 2 is a flow chart 200 describing the steps involved in the process of running a netlist query language document in order to search a netlist. To start 202, a technician or engineer creates a netlist query language document to perform the desired search of a netlist database 204. The netlist query language document is then submitted to a netlist query language server program 206. The netlist query language server program then runs the netlist query language document by translating the netlist query language document into subroutine calls that get data from the netlist database and manipulate the data according to the netlist query language syntax 208. At the completion of running the netlist query language document, the netlist query language server program delivers result reports and result tables that were created by running the netlist query language document 210. An engineer or technician then analyzes the result reports and the result tables to pinpoint circuit elements that should be investigated to determine if they pose a risk of creating topological circuit problems when an electrical circuit is manufactured as an integrated circuit 212. The analysis of the result documents by the engineer or technician 212 is the last step 214 in the process of running a netlist query language document 200.

Figure 3:
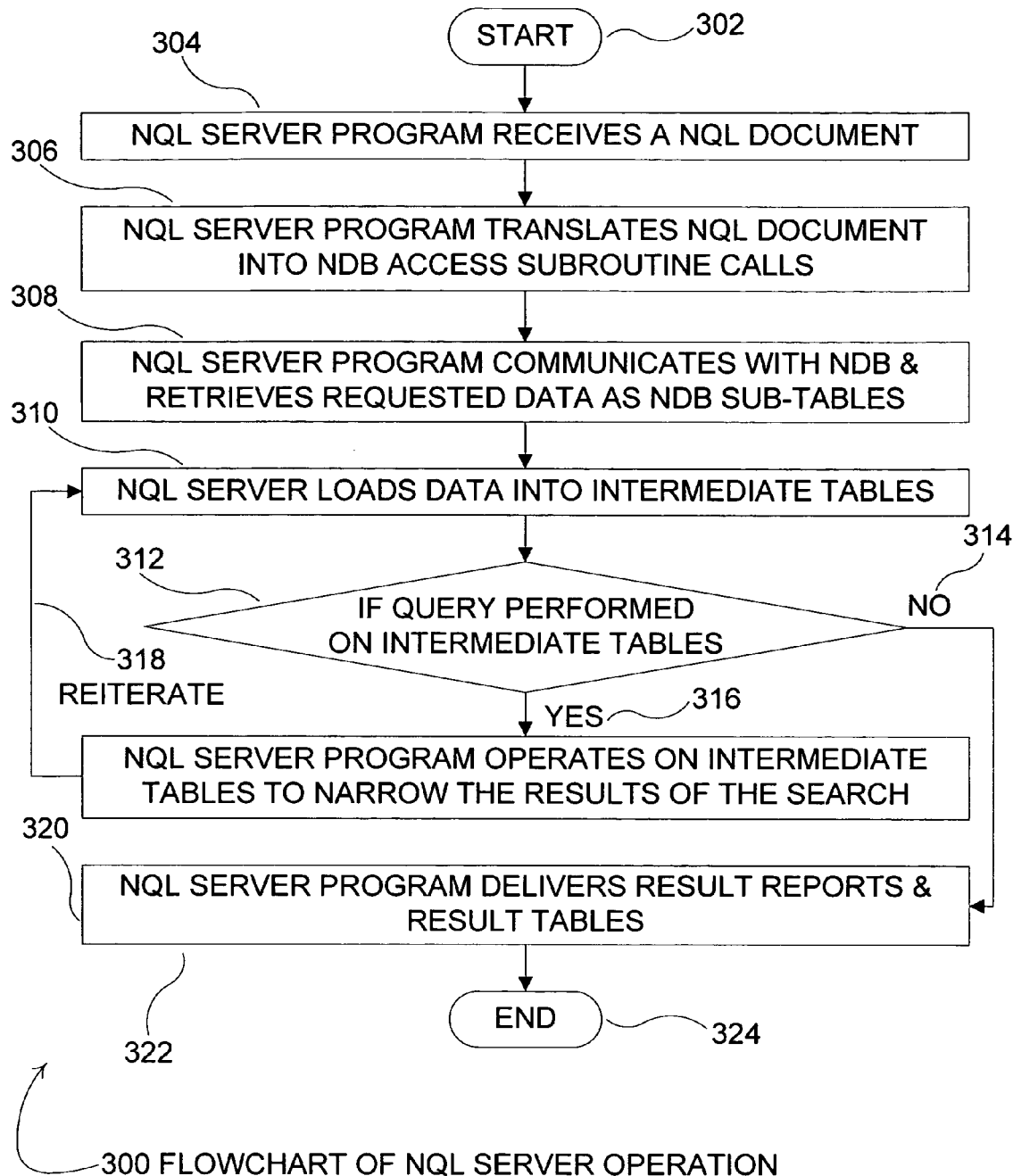
FIG. 3 is a flow chart describing the operation of an embodiment of a netlist query language server program.

FIG. 3 is a flow chart 300 describing the operation of an embodiment of a netlist query language server program. The netlist query language server program operation starts 302 by receiving a netlist query language document as an input 304. The netlist query language server program then translates the netlist query language document into netlist database access subroutine calls according to the netlist query language syntax 306. The netlist query language server program then communicates with the netlist database, via the netlist database subroutine calls, to retrieve the requested data as netlist database sub-tables 308. The netlist database server program then puts the netlist database sub-tables into intermediate data tables 310. The netlist query language server program then determines if there is a netlist query language statement that has not been performed that operates on an intermediate data table 312. If an intermediate data table is a source data table for a netlist query language statement 316, the netlist query language server program operates on the intermediate data table 320. The operations on an intermediate data table follow the same netlist query language syntax rules as operations on a netlist database table. The output table of the operation on the intermediate data table 320 is loaded into a new intermediate data table 310. The loop back 318 to loading the output table of a query operation on an intermediate data table into a new intermediate data table 310, is a reiterative loop 318 that may be repeated as necessary to completely run the netlist query language document. Once there are no more intermediate data tables that are the source for query statements that have not been evaluated 314, the netlist query language server delivers the result reports and result tables created by running the netlist query language document 322. The delivery of the result documents 322 is the last step 324 in the operation of the netlist query language server program.

Figure 4:
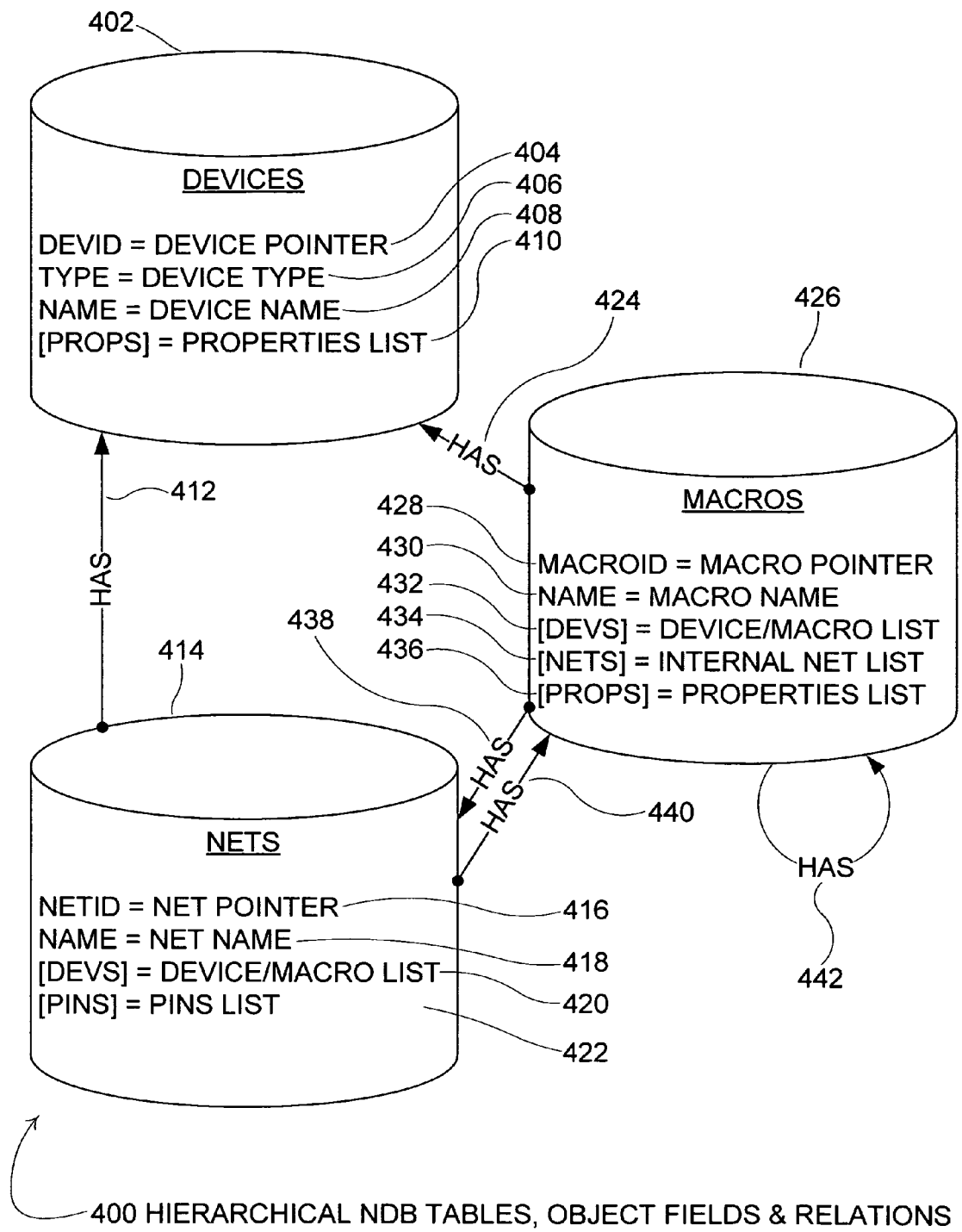
FIG. 4 is a schematic object and relationship illustration showing the data tables, object fields, and data table relationships of an embodiment of a hierarchical netlist database.

FIG. 4 is a schematic object and relationship illustration 400 showing the data tables, object fields, and data table relationships of an embodiment of a hierarchical netlist database. The hierarchical netlist database consists of three data tables, a devices table 402, a macros table, 426, and a nets table 414. Each device object stored in the devices table 402 is a database object structure that has properties defining characteristics of a primitive electrical device. An object property is also commonly called an object field for databases, or simply a data element of the object. The minimum data elements needed to define a device object includes a pointer to the device object 404 used to programmatically locate the device object, the type of the primitive electrical device 406 represented by the device object, the name of the primitive electrical device 408 represented by the device object, and a list of properties 410 that characterize the primitive electrical device represented by the device object. The list of properties 410 includes properties such as the resistance value for a resistor and the electrical connection points for any type of primitive electrical device.

Each macro object in the macros table 426 is a database object structure that has data elements defining characteristics of a macro. The minimum data elements needed to define a macro object includes a pointer to the macro object 428 used to programmatically locate the macro object, the name of the macro 430 represented by the macro object, a list of device and macro objects 432 that are part of the macro, a list of net objects 434 that are part of the macro, and a list of properties 436, such as external electrical connection points of the macro, that characterize the macro represented by the macro object. Device objects in the devices and macros list 432 for a macro object are selected from the devices table 402, hence, the macros table 426 has 424 device objects contained in the devices table 402. Macro objects in the devices and macros list 432 for a macro object are selected from the macros table 426, hence, the macros table 426 has 442 macro objects contained in the macros table 426. A macro object may not reference itself in the macro object devices and macros list 432. Net objects, defining the internal electrical connections of the macro, in the internal nets list 436 for a macro object are selected from the nets table 414, hence, the macros table 426 has 438 net objects contained in the nets table 414.

Each net object in the nets table 414 is a database object structure that has data elements defining characteristics of an electrical connection, or net. The minimum data elements needed to define a net object includes a pointer to the net object 416 used to programmatically locate the net object, the name of the net 418 represented by the net object, a list of device and macro objects 420 that are part of the net, and a list of electrical connection points, or pins 422, of each device and macro object contained in the net. It is possible that the data stored in the devices and macros list 420 and the pins list 422 may be contained in a single list defining both the devices and macros, and the electrical connection points, or pins, in one reference entry. Device objects in the devices and macros list 420 for a net object are selected from the devices table 402, hence, the nets table 414 has 412 device objects contained in the devices table 402. Macro objects in the devices and macros list 420 for a net object are selected from the macros table 426, hence, the nets table 414 has 440 macro objects contained in the macros table 426.

Figure 5:
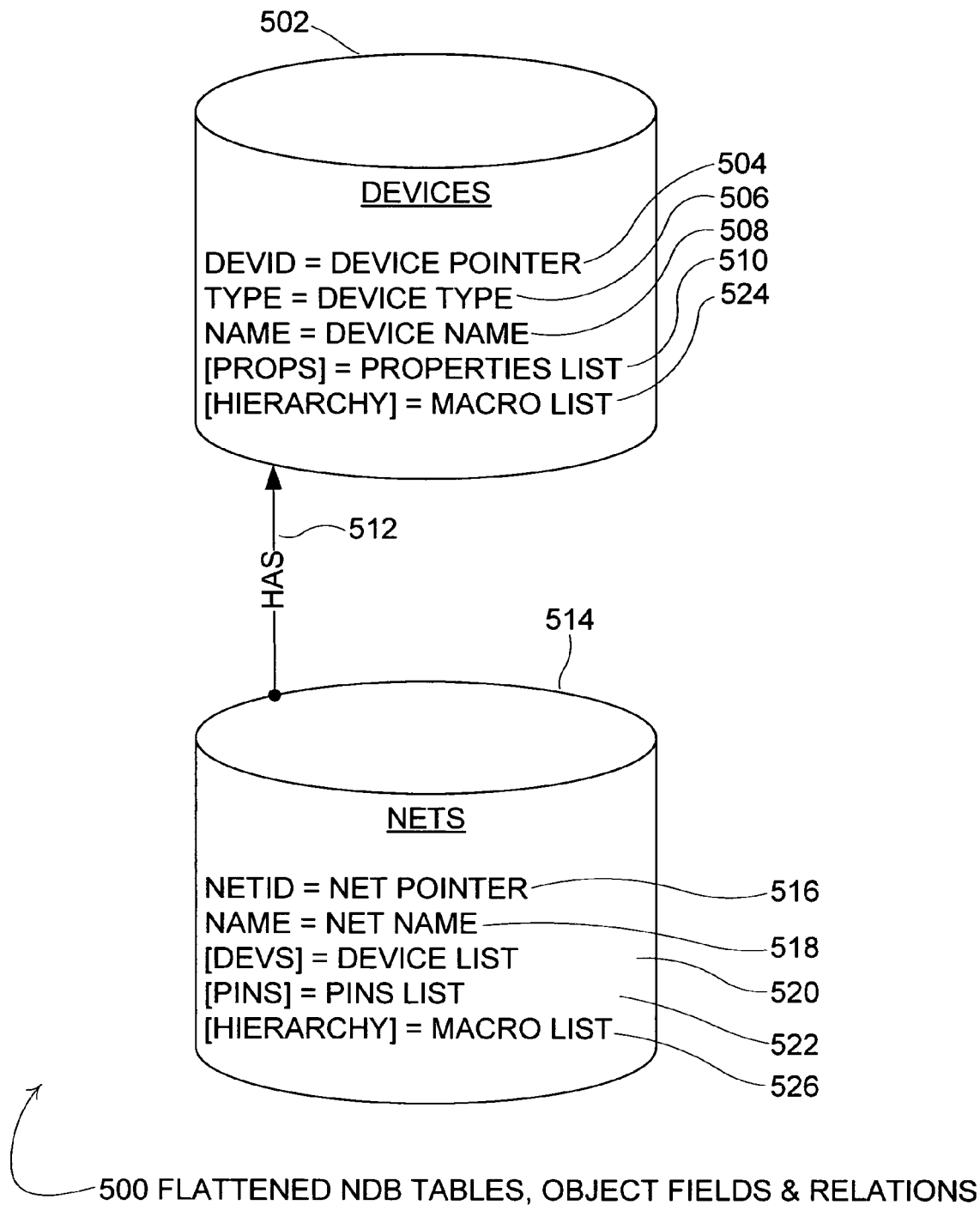
FIG. 5 is a schematic object and relationship illustration showing the data tables, object fields, and data table relationships of an embodiment of a flattened netlist database.

FIG. 5 is a schematic object and relationship illustration 500 showing the data tables, object fields, and data table relationships of an embodiment of a flattened netlist database. This is essentially the same netlist database structure as the hierarchical netlist database structure 400 disclosed in the description with respect to FIG. 4. The primary difference between the hierarchical netlist database structure 400 disclosed in the description with respect to FIG. 4, and the flattened netlist database structure 500 illustrated in FIG. 5, is that the flattened netlist database structure 500 does not have a separate table to store macros and macro attribute data contained in the parsed netlist data. The flattened netlist database consists of two data tables, a devices table 502 and a nets table 514. Each device object stored in the devices table 502 is a database object structure that has properties defining characteristics of a primitive electrical device. The device object structure contains a hierarchy field 524 to hold the macros and macro attribute data relevant to the primitive electrical device described by the device object. In addition to the hierarchy field 524, the minimum data elements needed to define a device object includes a pointer to the device object 504 used to programmatically locate the device object, the type of the primitive electrical device 506 represented by the device object, the name of the primitive electrical device 508 represented by the device object, and a list of properties 510 that characterize the primitive electrical device represented by the device object. The list of properties 510 includes properties such as the resistance value for a resistor and the electrical connection points for any type of primitive electrical device.

Each net object in the nets table 514 is a database object structure that has data elements defining characteristics of an electrical connection, or net. The net object structure contains a hierarchy field 526 to hold the macros and macro attribute data relevant to the primitive net described by the net object. In addition to the hierarchy field 526, the minimum data elements needed to define a net object includes a pointer to the net object 516 used to programmatically locate the net object, the name of the net 518 represented by the net object, a list of device objects 520 that are part of the net, and a list of electrical connection points, or pins 522, of each device object contained in the net. It is possible that the devices list 520, and the pins list 522 may be contained in a single list defining both the device and the device electrical connection point, or pin, in one reference. Device objects in the devices list 520 for a net object are selected from the devices table 502, hence, the nets table 514 has 512 device objects contained in the devices table 502.

Figure 6:
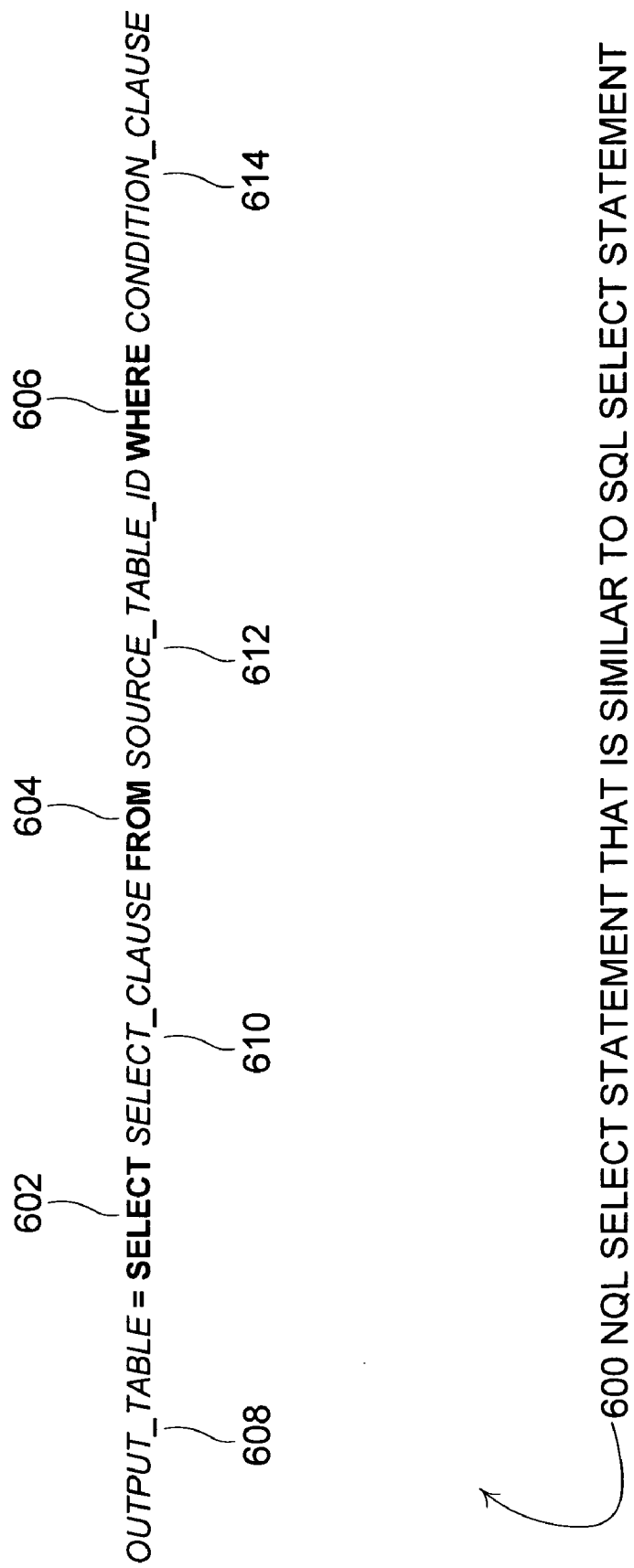
FIG. 6 is an illustration of the language syntax of a select statement for an embodiment of a netlist query language.

FIG. 6 is an illustration 600 of the language syntax of a select statement for an embodiment of a netlist query language. The select statement 600 is similar to the select statement of standard Structure Query Language (SQL). User familiarity with SQL means that by making the netlist query language syntax similar to the SQL syntax, users will be able to pick up and work with the netlist query language much more quickly than if a completely new computer language syntax were employed. The SELECT portion 602 of the statement is a key word meaning that the select clause 610 is the next word. The select clause 610 identifies the data elements of each data object that are going to be placed in the output table 608. The FROM portion 604 of the statement is a key word meaning that the source table will be named immediately following the key word FROM 604. The source table 612 is the netlist database table or the intermediate data table that will provide the data for the output table 608. The WHERE portion 606 of the statement is a key word meaning that the condition clause 614 immediately follows the key word WHERE 606. The condition clause 614 is a logical (Boolean) equation that decides whether information in a data object should be written to the output table 608.

While there is a similarity in the syntax of SQL and the netlist query language syntax, the actual operation that runs a netlist query language statement is different. A netlist query language document runs against an object oriented netlist database built to search for potential topological circuit problems within an electrical circuit schematic. A SQL statement operates against a generic relational database. SQL is not optimized to work with an object oriented netlist database, nor is SQL optimized to examine electrical circuit data to find topological circuit problems. The Netlist Query Language (NQL) is optimized to work with an object oriented netlist database to search for topological circuit problems within an electrical circuit schematic.

Figure 7:
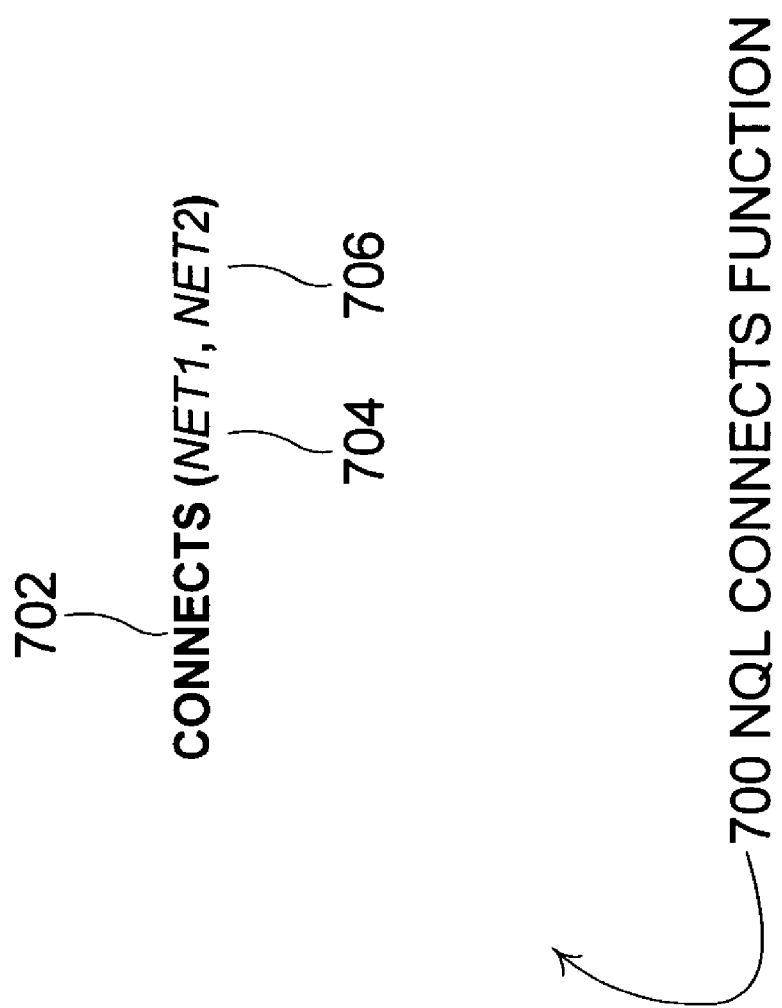
FIG. 7 is an illustration of the language syntax of a connects function for an embodiment of a netlist query language.

FIG. 7 is an illustration 700 of the language syntax of a connects function for an embodiment of a netlist query language. The connects function is a Boolean function that returns a true or false value depending on whether two nets (electrical connections) are electrically connected together. That is, the result value depends on whether the nets are electrically shorted together with no intervening primitive electrical devices. The connects function is delineated by the key word CONNECTS 702. Immediately following the key word CONNECTS 702, in parentheses, are the names of the two nets 704, 706 that are being evaluated to determine if the two nets 704, 706 are electrically connected together. If net one [704] and net two [706] are electrically connected together the connects function returns true, otherwise the connects function returns false. The connects function is not a part of the standard SQL syntax and is unique to the netlist query language.

Figure 8:
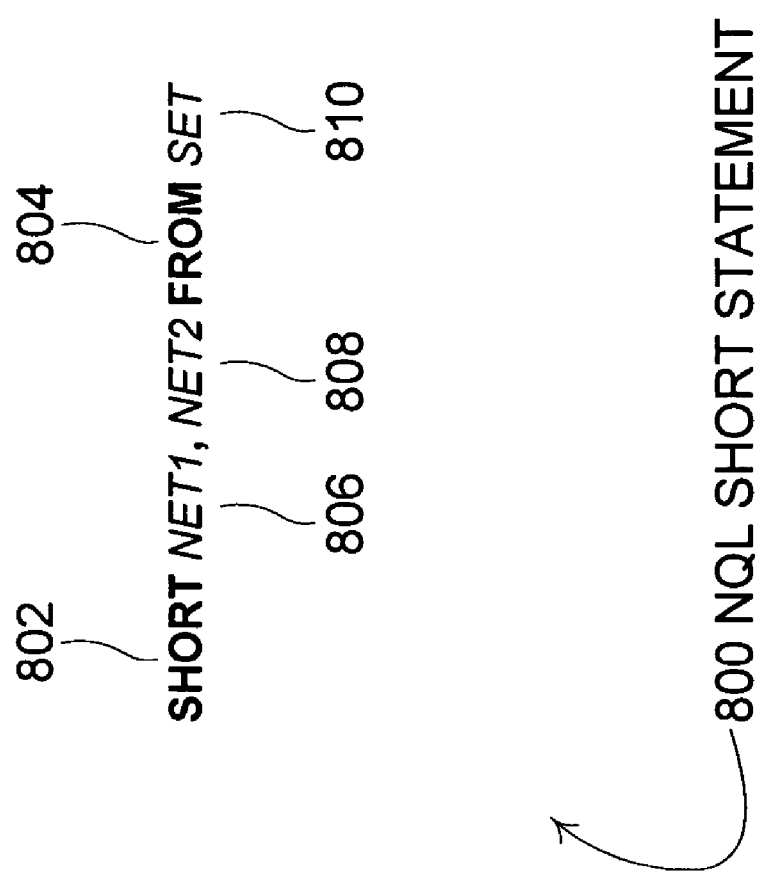
FIG. 8 is an illustration of the language syntax of a short statement for an embodiment of a netlist query language.

FIG. 8 is an illustration 800 of the language syntax of a short statement for an embodiment of a netlist query language. The short statement is a netlist query language statement that creates an electrical short between two nets by updating the electrical data stored in the netlist database to remove electrical devices between the two nets, and replace the electrical devices with electrical shorts. The short netlist query language statement begins with the key word SHORT 802. Immediately following the key word SHORT 802 are the names of the two nets 806, 808 that are being electrically shorted together. Following the names of the two nets 806, 808 is the key word FROM 804. Immediately following the key word FROM 804 is the name of a set 810, or data table, containing a list of electrical devices. The electrical devices contained in the set 810 are the electrical devices that will be removed and replaced with an electrical short in order to electrically connect the two nets 806, 808. The short netlist query language statement is not a part of the standard SQL syntax and is unique to the netlist query language.

Figure 9:
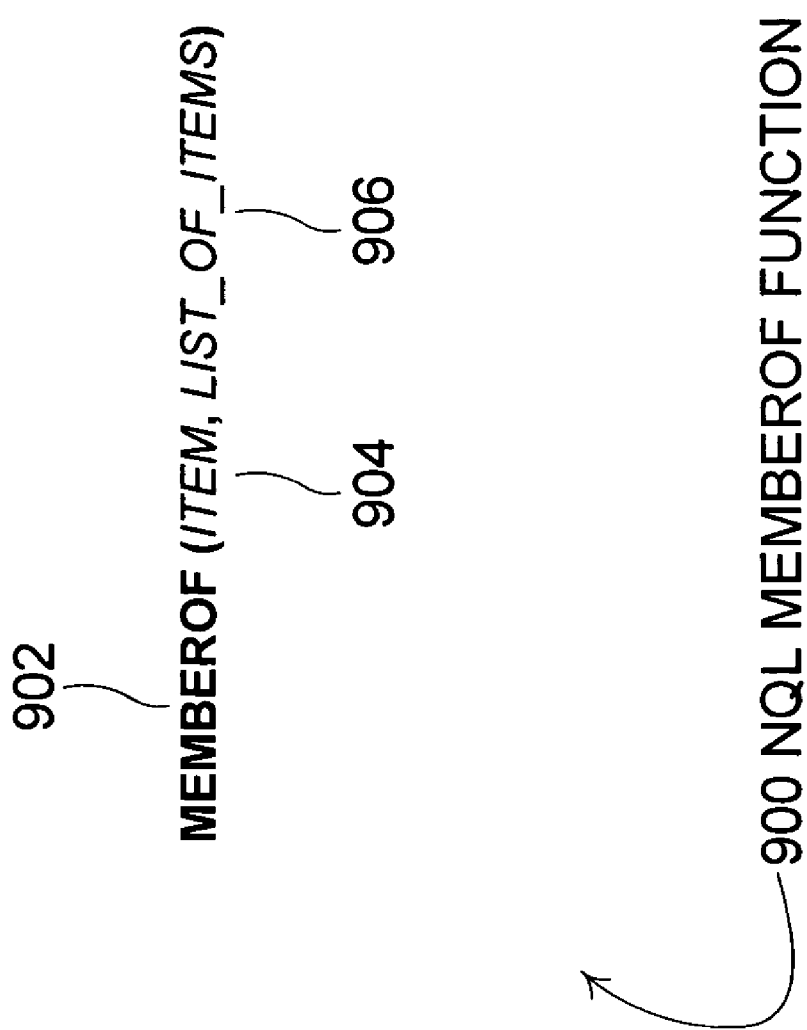
FIG. 9 is an illustration of the language syntax of a member of function for an embodiment of a netlist query language.

FIG. 9 is an illustration 900 of the language syntax of a member of function for an embodiment of a netlist query language. The member of function is a Boolean function that returns a true or false value depending whether an item 904 is contained in a list of items 906. The member of function is delineated by the key word MEMBER OF 902. Immediately following the key word MEMBER 902, in parentheses, is the name of an item 904, and the name of a list of items 906. The list of items 906 is a data table that may be the result of a prior netlist query language statement, or a netlist database table. If the specified item 904 is contained in the list of items 906, the member of function returns true, otherwise the member of function returns false. The member of function is not a part of the standard SQL syntax and is unique to the netlist query language.

FIG. 10 is an illustration 1000 of the language syntax of an embedded query syntax for an embodiment of a netlist query language. The embedded query syntax is used to embed a query within another netlist query language statement. The syntax to embed a query is to name a set 1002 which is immediately followed by a Boolean conditions clause 1004. The Boolean conditions clause 1004 is placed within parentheses. The Boolean conditions clause 1004 is a set of logical equations that evaluate to a single Boolean true or false value. The embedded query performs much like a standard SQL select statement. The source data table is defined by the set 1002. All fields of the source data table 1002 are selected. The conditions clause 1004 operates in a similar manner to the where condition of the SQL select statement, in that the condition clause 1004 limits which objects in the set 1002 will be included in a temporary output table. If the condition clause 1004 evaluates to true, a data object is included in the temporary output table, otherwise the data object is not included. When using the embedded query syntax, the temporary output table is only available to the parent netlist query language statement, and is not stored as an intermediate data table for use by other netlist query language statements. The embedded query syntax is not a part of the standard SQL syntax and is unique to the netlist query language.

Figure 11:
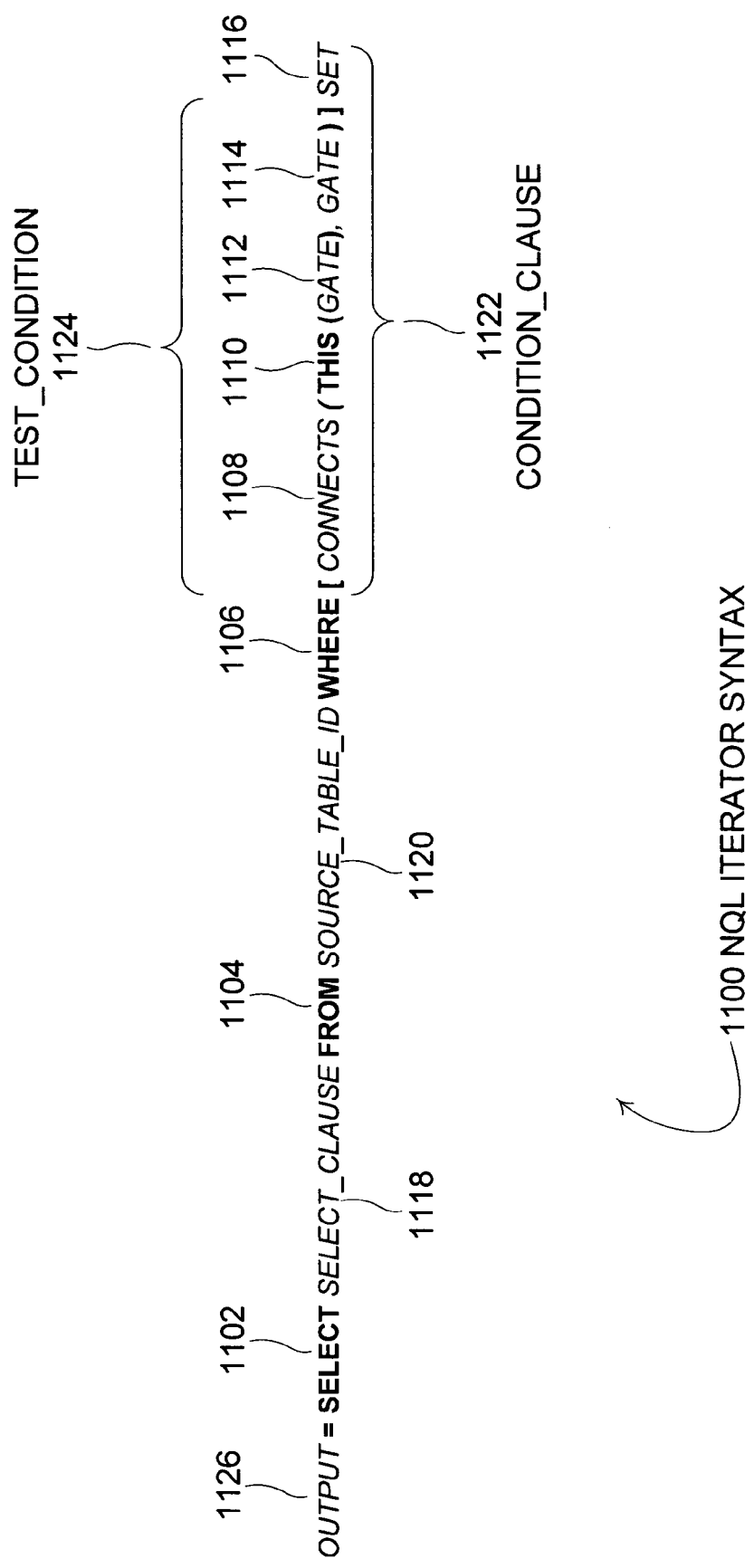
FIG. 11 is an illustration of the language syntax of an iterator syntax for an embodiment of a netlist query language.

FIG. 11 is an illustration of the language syntax of an iterator syntax for an embodiment of a netlist query language. To best illustrate the iterator syntax, a full select statement containing the iterator syntax is shown. The select statement is equivalent to the select statement disclosed with respect to the description of FIG. 6. The SELECT key word 1102, FROM key word 1104, WHERE key word, 1106, output table 1126, select clause 1118, source table identification 1120, and condition clause 1122 all serve the same purpose as described for the select statement disclosed with respect to the description of FIG. 6. The connects function 1108 is also shown to illustrate the iterator syntax. The connects function 1108 is equivalent to the connects function disclosed with respect to the description of FIG. 7. The gates 1112, 1114 indicates the name of a net data element contained in the source table 1120, and a test set 1116 that is being compared to the source table 1120. The test set 1116 is a data table containing data objects that will be compared to the source table 1120 data objects. The test condition 1124 that is going to be iterated is placed within brackets. The test condition 1124 is immediately followed by the name of a set 1116 that is to be compared to the source table 1120. The THIS key word 1110 is used to indicate that a field being evaluated comes from the source table 1120. If a field name does not follow the THIS key word 1110, then the field name indicates data that comes from the test set 1116. In the example shown 1100, each data object of the source table 1120 that has a gate 1112 that is electrically connected to the gate 1114 of any data object contained in the test set 1116 will be included in the output table 1126. In other words, the source table 1120 gate 1112 is iteratively tested against each gate 1114 of every data object in the test set 1116 to determine if the source data object should be included in the output table 1126. The iterator syntax is not a part of the standard SQL syntax and is unique to the netlist query language.

Figure 12:
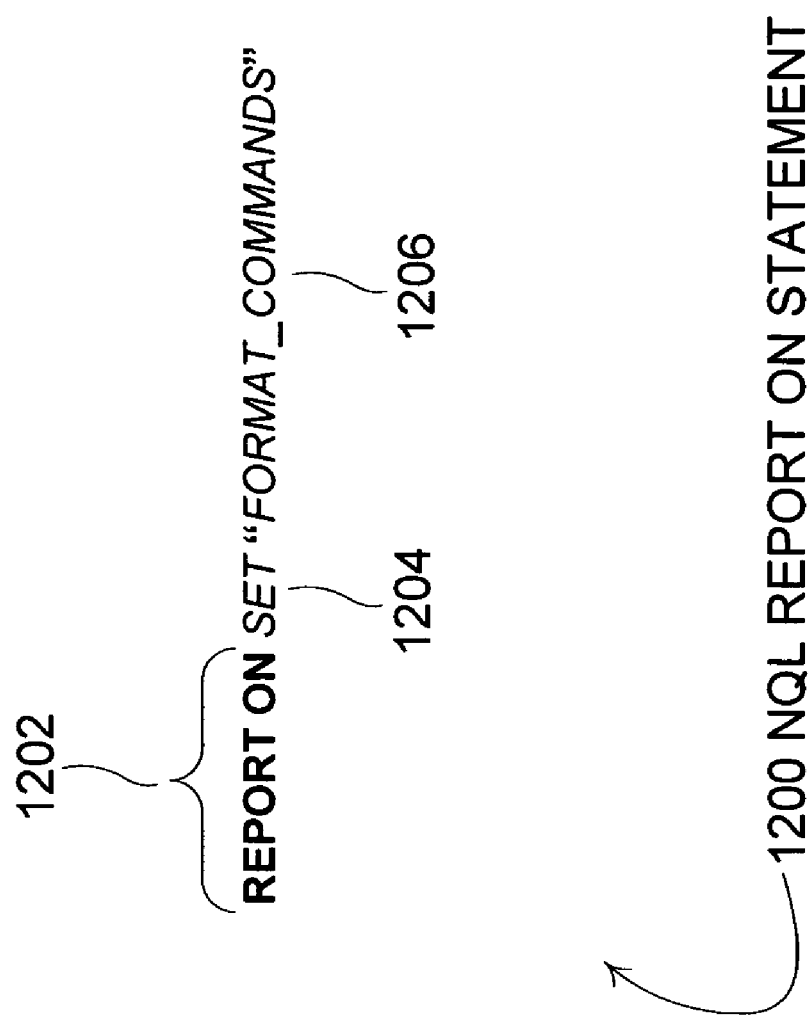
FIG. 12 is an illustration of the language syntax of a report on statement for an embodiment of a netlist query language.

FIG. 12 is an illustration 1200 of the language syntax of a report on statement for an embodiment of a netlist query language. The report on statement is a netlist query language statement that creates a formatted text result report based a specified data table. The report on netlist query language statement begins with the key words REPORT ON 1202. Immediately following the key words REPORT ON 1202 is the name of a set 1204 indicating the data table that is the source of data for the text formatted report. Following the set 1204 are the format commands 1206 that indicate the actual text formatting of the report. The report on netlist query language statement is not a part of the standard SQL syntax and is unique to the netlist query language.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A netlist query language server program for translating a netlist query language document that defines how to read and update a netlist database comprising:

a computer system that runs said netlist query language server program and that stores said netlist guery language server program on an electronic storage medium included as part of said computer system;

a netlist query language document input that accepts said netlist query language document, said netlist query language document consisting of netlist query language statements, each netlist query language statement of said netlist query language statements being capable of operating on netlist database tables and intermediate data tables, said netlist database tables being electrical circuit data tables contained in said netlist database and said intermediate data tables being output tables produced by previously completed netlist query language statements of said netlist query language statements, and said netlist query language statements being written in a netlist query language, said netlist query language comprising:

a netlist query language syntax that is similar to standard structured query language syntax, said netlist query language syntax defining syntax rules for writing said netlist query language statements, said netlist query language statements being commands that read and update said netlist database, said netlist database being an object oriented database storing electrical circuit data, said electrical circuit data being representative of device data, device attribute data, macro data, macro attribute data, connection data, and connection attribute data of an electrical circuit, and said netlist database providing netlist database access subroutines for reading and updating said electrical circuit data stored in said netlist database;

dynamic memory tables for holding said intermediate data tables;

intermediate data table manipulation subroutines that perform netlist query language operations on said intermediate data tables;

a netlist query language interpreter algorithm that translates said netlist query language statements into netlist database access subroutines calls and intermediate table manipulation subroutine calls, said netlist database access subroutine calls and said intermediate table manipulation subroutine calls chosen according to said netlist query language syntax, said netlist database access subroutine calls being programmatic calls to said netlist database access subroutines that read and update said netlist database, said intermediate table manipulation subroutine calls being programmatic calls to said intermediate table manipulation subroutines;

a netlist database dynamic link to permit said netlist query language server program to invoke said netlist database access subroutine calls;

a netlist database sub-table input for receiving netlist database sub-tables from said netlist database as requested by said netlist database access subroutine calls, said netlist database sub-tables being stored as said intermediate data tables; and a result output for delivering result tables, said result tables being output tables produced by said netlist query language statements.

2. The netlist query language server program of claim 1 wherein said device data is representative of the number of primitive electrical devices and the names of each of said primitive electrical devices contained in said electrical circuit data, where said primitive electrical devices are electrical devices that cannot be broken down into any sub-devices.

3. The netlist query language server program of claim 1 wherein said device attribute data is representative of electrical connection points, electrical device type, and additional electrical characteristics of each device enumerated in said device data.

4. The netlist query language server program of claim 1 wherein said macro data is representative of the number of macros and the names of each of said macros contained in said electrical circuit data, wherein a macro is a named combination of primitive electrical devices and other macros, and electrical connections of said primitive electrical devices and said other macros.

5. The netlist query language server program of claim 1 wherein said macro attribute data is representative of names of primitive electrical devices, names of other macros, names of connections of said primitive electrical devices and said other macros, and external electrical connection points of each macro enumerated in said macro data, where said names of primitive electrical devices are selected from said device data, said names of other macros are selected from said macro data, and said names of connections are selected from said connection data.

6. The netlist query language server program of claim 1 wherein said connection data is representative of the number of electrical connections and the names of each of said electrical connections that are contained in said electrical circuit data.

7. The netlist query language server program of claim 1 wherein said connection attribute data is representative of names of primitive electrical devices, names of macros, and electrical connection points of said primitive electrical devices and said macros of each connection enumerated in said connection data, where said names of primitive electrical devices are selected from said device data and said names of macros are selected from said macro data.

8. The netlist query language server program of claim 1 wherein said netlist database further comprises:

a device object data structure that is capable of storing a device name and said device attribute data for a primitive electrical device;

a devices table that stores device objects that are instances of said device object data structure such that there is a device object instance for each device enumerated in said device data, each said device object instance containing said device attribute data of each of said devices enumerated in said device data;

a macro object data structure that is capable of storing a macro name and said macro attribute data for a macro;

a macros table that stores macro objects that are instances of said macro object data structure such that there is a macro object instance for each macro enumerated in said macro data, each said macro object instance containing said macro attribute data of each of said macros enumerated in said macro data;

a net object data structure that is capable of storing a connection name and said connection attribute data for an electrical connection;

a nets table that stores net objects that are instances of said net object data structure such that there is a net object instance for each connection enumerated in said connection data, each said net object instance containing said connection attribute data or each of said connections enumerated in said connection data;

table access subroutines that permit said external software program to retrieve and update data stored in said devices table, said macros table, and said nets table; and object access subroutines that permit said external software program to retrieve and update data stored in said device object data structure, said macro object data structure, and said net object data structure, and where said table access subroutines and said object access subroutines combine to make up said netlist database access subroutines.

9. The netlist query language server program of claim 8, wherein said macro object data structure further comprises:

an apparatus object pointers list that stores apparatus object pointers that are instances of a pointer to an apparatus object such that there is an apparatus object pointer instance for each apparatus object named in said macro attribute data; and an internal macro net object pointers list that stores internal macro net object pointers that are instances of a pointer to an internal macro net object such that there is an internal macro net object pointer for each connection named in said macro attribute data.

10. The netlist query language server program of claim 9 wherein said apparatus objects comprise at least one of the group comprising: an instance of said device object data structure, and an instance of said macro object data structure.

11. The netlist query language server program of claim 8, wherein said net object data structure further comprises an apparatus object pointers list that stores apparatus object pointers that are instances of a pointer to an apparatus object such that there is an apparatus object pointer instance for each apparatus object named in said connection attribute data.

12. The netlist query language server program of claim 11 wherein said apparatus objects comprise at least one of the group comprising: an instance of said device object data structure, and an instance of said macro object data structure.

13. The netlist query language server program of claim 1 wherein said netlist database further comprises:
a device object data structure that is capable of storing a device name and said device attribute data for a primitive electrical device, said device object data structure further being capable of storing a hierarchy of macro names, said hierarchy of macro names being an ordered list of all macros possessing said primitive electrical device;
a devices table that stores device objects that are instances of said device object data structure such that there is a device object instance for each device enumerated in said device data, each said device object instance containing said device attribute data of each of said devices enumerated in said device data, and each said device object instance further containing said hierarchy of macro names enumerating macros possessing each of said devices, each of said macros being enumerated in said macro data and each of said devices possessed by each of said macros being enumerated in said macro attribute data;
a net object data structure that is capable of storing a connection name and said connection attribute data for an electrical connection, said net object data structure further being capable of storing a hierarchy of macro names, said hierarchy of macro names being an ordered list of all macros possessing said electrical connection;
a nets table that stores net objects that are instances of said net object data structure such that there is a net object instance for each connection enumerated in said connection data, each said net object instance containing said connection attribute data of each of said connections enumerated in said connection data, and each said net object instance further containing said hierarchy of macro names enumerating macros possessing each of said connections, each of said macros being enumerated in said macro data and each of said connections possessed by each of said macros being enumerated in said macro attribute data;
table access subroutines that permit said external software program to retrieve and update data stored in said devices table and said nets table; and
object access subroutines that permit said external software program to retrieve and update data stored in said device object data structure and said net object data structure, and where said table access subroutines and said object access subroutines combine to make up said netlist database access subroutines.

14. The netlist query language server program of claim 13, wherein said net object data structure further comprises a device object pointers list that stores device object pointers that are instances of a pointer to a device object such that there is a device object pointer instance for each device object named in said connection attribute data.

15. The netlist query language server program of claim 1 wherein said netlist query language syntax further comprises a syntax rule that defines that a list of said netlist query language statements is evaluated sequentially from first netlist query language statement to last netlist query language statement.

16. The netlist query language server program of claim 1 wherein said netlist query language syntax further comprises a Boolean connects function that accepts the names of two electrical connections from said electrical circuit data, said Boolean connects function returning a true result if said two electrical connections are electrically connected, and said Boolean connects function returning a false result if said two electrical connections are not electrically connected.

17. The netlist query language server program of claim 1 wherein said netlist query language syntax further comprises a short statement that accepts the names of two electrical connections from said electrical circuit data and a list of devices selected from said electrical circuit data, said short statement updating said electrical circuit data to replace each device in said list of devices with an electrical short connection between said two electrical connections.

18. The netlist query language of claim 1 wherein said netlist query language syntax further comprises a Boolean member of function that accepts a name of an item in said electrical circuit data and a list of items selected from said electrical circuit data, said Boolean member of function returning a true result if said item is a member of said list of items, and said Boolean member of function returning a false result if said item is not a member of said list, of items.

19. The netlist query language server program of claim 1 wherein said netlist query language syntax further comprises a command syntax which creates a formatted text report of said electrical circuit data retrieved from said netlist database.

20. The netlist query language server program of claim 1 wherein said netlist query language contains a select statement to retrieve a specified subset of data from a source data table, said select statement being similar to a standard structured query language select statement, said select statement creating a select output data table as a result of evaluating said select statement, and said select statement consisting of a select clause, a source table identifier, and a condition clause, said select clause defining elements of data retrieved from said source data table, said source table identifier defining said source data table, and said condition clause defining a Boolean condition that determines if a source data table entry is included as an entry in said select output data table, said source data table entry being included only if said condition clause is true.

21. The netlist query language server program of claim 20 wherein said netlist query language syntax further comprises an embedded query syntax that embeds said select statement as a child select statement within a parent netlist query language statement, said embedded query syntax creating a temporary child select output table that is operated on by said parent netlist query language statement, said temporary child select output table being destroyed once said parent query language statement is evaluated.

22. The netlist query language server program of claim 20 wherein said netlist query language syntax further comprises an iterator syntax that permits Boolean testing of each entry from said source data table of said select statement against each entry in a comparison data table in order to achieve a Boolean iterator result for each said source data table entry, said select statement adding an entry corresponding to said source data table entry to said select output data table if said Boolean iterator result is true.

23. A method of searching a netlist database to find topological circuit problems comprising the steps of:
creating a netlist query language document that is designed to find said topological circuit problems, said netlist query language document consisting of netlist query language statements, each netlist query language statement of said netlist query language statements operating on netlist database tables and intermediate data tables, said netlist database tables being electrical circuit data tables contained in said netlist database and said intermediate data tables being output tables of other netlist query language statements of said netlist query language statements, and said netlist query language statements being written in a netlist query language, said netlist query language comprising:
a netlist query language syntax that is similar to standard structured query language syntax, said netlist query language syntax defining syntax rules for writing said netlist query language statements, said netlist query language statements being commands that read and update said netlist database, said netlist database being an object oriented database storing electrical circuit data, said electrical circuit data being representative of device data, device attribute data, macro data, macro attribute data, connection data, and connection attribute data of an electrical circuit, and said netlist database providing netlist database access subroutines for reading and updating said electrical circuit data stored in said netlist database;
submitting said netlist query language document to a netlist query language server program, said netlist query language server program comprising:
a netlist query language document input that accepts said netlist query language document;
dynamic memory tables for holding said intermediate data tables;
intermediate data table manipulation subroutines that perform netlist query language operations on said intermediate data tables;
a netlist query language interpreter algorithm that translates said netlist query language statements into netlist database access subroutines calls and intermediate table manipulation subroutine calls, said netlist database access subroutine calls and said intermediate table manipulation subroutine calls chosen according to said netlist query language syntax, said netlist database access subroutine calls being programmatic calls to said netlist database access subroutines that read and update said netlist database, said intermediate table manipulation subroutine calls being programmatic calls to said intermediate table manipulation subroutines;
a netlist database dynamic link to permit said netlist query language server program to invoke said netlist database access subroutine calls;
a netlist database sub-table input for receiving netlist database sub-tables from said netlist database as requested by said netlist database access subroutine calls, said netlist database sub-tables being stored as said intermediate data tables; and
a result output for delivering result tables, said result tables being output tables produced by said netlist query language statements; and
inspecting said result tables to locate said topological circuit problems.

24. The method of claim 23 wherein said device data is representative of the number of primitive electrical devices and the names of each of said primitive electrical devices contained in said electrical circuit data, where said primitive electrical devices are electrical devices that cannot be broken down into any sub-devices.

25. The method of claim 23 wherein said device attribute data is representative of electrical connection points, electrical device type, and additional electrical characteristics of each device enumerated in said device data.

26. The method of claim 23 wherein said macro data is representative of the number of macros and the names of each of said macros contained in said electrical circuit data, wherein a macro is a named combination of primitive electrical devices and other macros, and electrical connections of said primitive electrical devices and said other macros.

27. The method of claim 23 wherein said macro attribute data is representative of names of primitive electrical devices, names of other macros, names of connections of said primitive electrical devices and said other macros, and external electrical connection points of each macro enumerated in said macro data, where said names of primitive electrical devices are selected from said device data, said names of other macros are selected from said macro data, and said names of connections are selected from said connection data.

28. The method of claim 23 wherein said connection data is representative of the number of electrical connections and the names of each of said electrical connections that are contained in said electrical circuit data.

29. The method of claim 23 wherein said connection attribute data is representative of names of primitive electrical devices, names of macros, and electrical connection points of said primitive electrical devices and said macros of each connection enumerated in said connection data, where said names of primitive electrical devices are selected from said device data and said names of macros are selected from said macro data.

30. The method of claim 23 wherein said netlist database further comprises:
a device object data structure that is capable of storing a device name and said device attribute data for a primitive electrical device;
a devices table that stores device objects that are instances of said device object data structure such that there is a device object instance for each device enumerated in said device data, each said device object instance containing said device attribute data of each of said devices enumerated in said device data;
a macro object data structure that is capable of storing a macro name and said macro attribute data for a macro;
a macros table that stores macro objects that are instances of said macro object data structure such that there is a macro object instance for each macro enumerated in said macro data, each said macro object instance containing said macro attribute data of each of said macros enumerated in said macro data;
a net object data structure that is capable of storing a connection name and said connection attribute data for an electrical connection;

a nets table that stores net objects that are instances of said net object data structure such that there is a net object instance for each connection enumerated in said connection data, each said net object instance containing said connection attribute data of each of said connections enumerated in said connection data;

table access subroutines that permit said external software program to retrieve and update data stored in said devices table, said macros table, and said nets table; and object access subroutines that permit said external software program to retrieve and update data stored in said device object data structure, said macro object data structure, and said net object data structure, and where said table access subroutines and said object access subroutines combine to make up said netlist database access subroutines.

31. The method of claim 30, wherein said macro object data structure further comprises:

an apparatus object pointers list that stores apparatus object pointers that are instances of a pointer to an apparatus object such that there is an apparatus object pointer instance for each apparatus object named in said macro attribute data; and an internal macro net object pointers list that stores internal macro net object pointers that are instances of a pointer to an internal macro net object such that there is an internal macro net object pointer for each connection named in said macro attribute data.

32. The method of claim 31 wherein said apparatus objects comprise at least one of the group comprising: an instance of said device object data structure, and an instance of said macro object data structure.

33. The method of claim 30, wherein said net object data structure further comprises an apparatus object pointers list that stores apparatus object pointers that are instances of a pointer to an apparatus object such that there is an apparatus object pointer instance for each apparatus object named in said connection attribute data.

34. The method of claim 33 wherein said apparatus objects comprise at least one of the group comprising: an instance of said device object data structure, and an instance of said macro object data structure.

35. The method of claim 23 wherein said netlist database further comprises:

a device object data structure that is capable of storing a device name and said device attribute data for a primitive electrical device, said device object data structure further being capable of storing a hierarchy of macro names, said hierarchy of macro names being an ordered list of all macros possessing said primitive electrical device;

a devices table that stores device objects that are instances of said device object data structure such that there is a device object instance for each device enumerated in said device data, each said device object instance containing said device attribute data of each of said devices enumerated in said device data, and each said device object instance further containing said hierarchy of macro names enumerating macros possessing each of said devices, each of said macros being enumerated in said macro data and each of said devices possessed by each of said macros being enumerated in said macro attribute data;

a net object data structure that is capable of storing a connection name and said connection attribute data for an electrical connection, said net object data structure further being capable of storing a hierarchy of macro names, said hierarchy of macro names being an ordered list of all macros possessing said electrical connection;

a nets table that stores net objects that are instances of said net object data structure such that there is a net object instance for each connection enumerated in said connection data, each said net object instance containing said connection attribute data of each of said connections enumerated in said connection data, and each said net object instance further containing said hierarchy of macro names enumerating macros possessing each of said connections, each of said macros being enumerated in said macro data and each of said connections possessed by each of said macros being enumerated in said macro attribute data;

table access subroutines that permit said external software program to retrieve and update data stored in said devices table and said nets table; and object access subroutines that permit said external software program to retrieve and update data stored in said device object data structure and said net object data structure, and where said table access subroutines and said object access subroutines combine to make up said netlist database access subroutines.

36. The method of claim 35, wherein said net object data structure further comprises a device object pointers list that stores device object pointers that are instances of a pointer to a device object such that there is a device object pointer instance for each device object named in said connection attribute data.

37. The method of claim 23 wherein said netlist query language syntax further comprises a syntax rule that defines that a list of said netlist query language statements is evaluated sequentially from first netlist query language statement to last netlist query language statement.

38. The method of claim 23 wherein said netlist query language syntax further comprises a Boolean connects function that accepts the names of two electrical connections from said electrical circuit data, said Boolean connects function returning a true result if said two electrical connections are electrically connected, and said Boolean connects function returning a false result if said two electrical connections are not electrically connected.

39. The method of claim 23 wherein said netlist query language syntax further comprises a short statement that accepts the names of two electrical connections from said electrical circuit data and a list of devices selected from said electrical circuit data, said short statement updating said electrical circuit data to replace each device in said list of devices with an electrical short connection between said two electrical connections.

40. The method of claim 23 wherein said netlist query language syntax further comprises a Boolean member of function that accepts a name of an item in said electrical circuit data and a list of items selected from said electrical circuit data, said Boolean member of function returning a true result if said item is a member of said list of items, and said Boolean member of function returning a false result if said item is not a member of said list of items.

41. The method of claim 23 wherein said netlist query language syntax further comprises a command syntax which creates a formatted text report of said electrical circuit data retrieved from said netlist database.

42. The method of claim 23 wherein said netlist query language contains a select statement to retrieve a specified subset of data from a source data table, said select statement being similar to a standard structured query language select statement, said select statement creating a select output data table as a result of evaluating said select statement, and said select statement consisting of a select clause, a source table identifier, and a condition clause, said select clause defining elements of data retrieved from said source data table, said source table identifier defining said source data table, and said condition clause defining a Boolean condition that determines if a source data table entry is included as an entry in said select output data table, said source data table entry being included only if said condition clause is true.

43. The method of claim 42 wherein said netlist query language syntax further comprises an embedded query syntax that embeds said select statement as a child select statement within a parent netlist query language statement, said embedded query syntax creating a temporary child select output table that is operated on by said parent netlist query language statement, said temporary child select output table being destroyed once said parent query language statement is evaluated.

44. The method of claim 42 wherein said netlist query language syntax further comprises an iterator syntax that permits Boolean testing of each entry from said source data table of said select statement against each entry in a comparison data table in order to achieve a Boolean iterator result for each said source data table entry, said select statement adding an entry corresponding to said source data table entry to said select output data table if said Boolean iterator result is true.

45. The method of claim 23 wherein said netlist query document is submitted to said netlist query language server program before said electrical circuit is laid out in an integrated circuit layout software tool.

46. The method of claim 23 wherein said topological circuit problems are parasitic problems associated with physical layout of said electrical circuit when said electrical circuit is manufactured as an integrated circuit.

* * * * *